United States Patent
Chin

(10) Patent No.: US 7,061,979 B1
(45) Date of Patent: Jun. 13, 2006

(54) SYSTEM AND METHOD FOR DETERMINING THE DATA RATE OF A DIGITAL DATA STREAM

(75) Inventor: Hon Wah Chin, Palo Alto, CA (US)

(73) Assignee: CIENA Corporation, Linthicum, MD (US)

( * ) Notice: Subject to any disclaimer, the term of this patent is extended or adjusted under 35 U.S.C. 154(b) by 1139 days.

(21) Appl. No.: 09/823,410

(22) Filed: Mar. 30, 2001

Related U.S. Application Data

(60) Provisional application No. 60/208,005, filed on May 26, 2000.

(51) Int. Cl.
  *H03K 9/08* (2006.01)
  *H04B 3/46* (2006.01)

(52) U.S. Cl. ............ 375/238; 375/225; 370/212; 329/312; 341/61

(58) Field of Classification Search ........ 375/225, 375/238–239, 282, 333, 360–361; 370/212–213, 370/232–234; 329/312, 313, 314; 332/109–114; 341/61, 68–70
See application file for complete search history.

(56) References Cited

U.S. PATENT DOCUMENTS

| | | | | |
|---|---|---|---|---|
| 4,888,763 A | * | 12/1989 | Hatfield et al. | 370/445 |
| 5,675,609 A | * | 10/1997 | Johnson | 375/237 |
| 6,084,694 A | | 7/2000 | Milton et al. | 359/124 |
| 6,360,090 B1 | * | 3/2002 | Holcombe et al. | 455/307 |
| 6,594,309 B1 | * | 7/2003 | Botti et al. | 375/238 |
| 6,888,886 B1 | * | 5/2005 | Ito | 375/225 |

* cited by examiner

*Primary Examiner*—Young T. Tse
(74) *Attorney, Agent, or Firm*—Merck, Blackmon & Voorhees, LLC

(57) ABSTRACT

A system and method for determining a minimum pulse width for a digital data stream is described herein. The minimum pulse width is used to infer the data rate for the digital data stream. A measuring cell is used to measure the pulse widths by utilizing RC time constants. The measuring cell comprises a capacitor whose voltage is related to the pulse width. This voltage is then transferred by the measuring cell to a measurement node which determines the minimum pulse width of all the transferred voltages for the plurality of pulses.

14 Claims, 8 Drawing Sheets

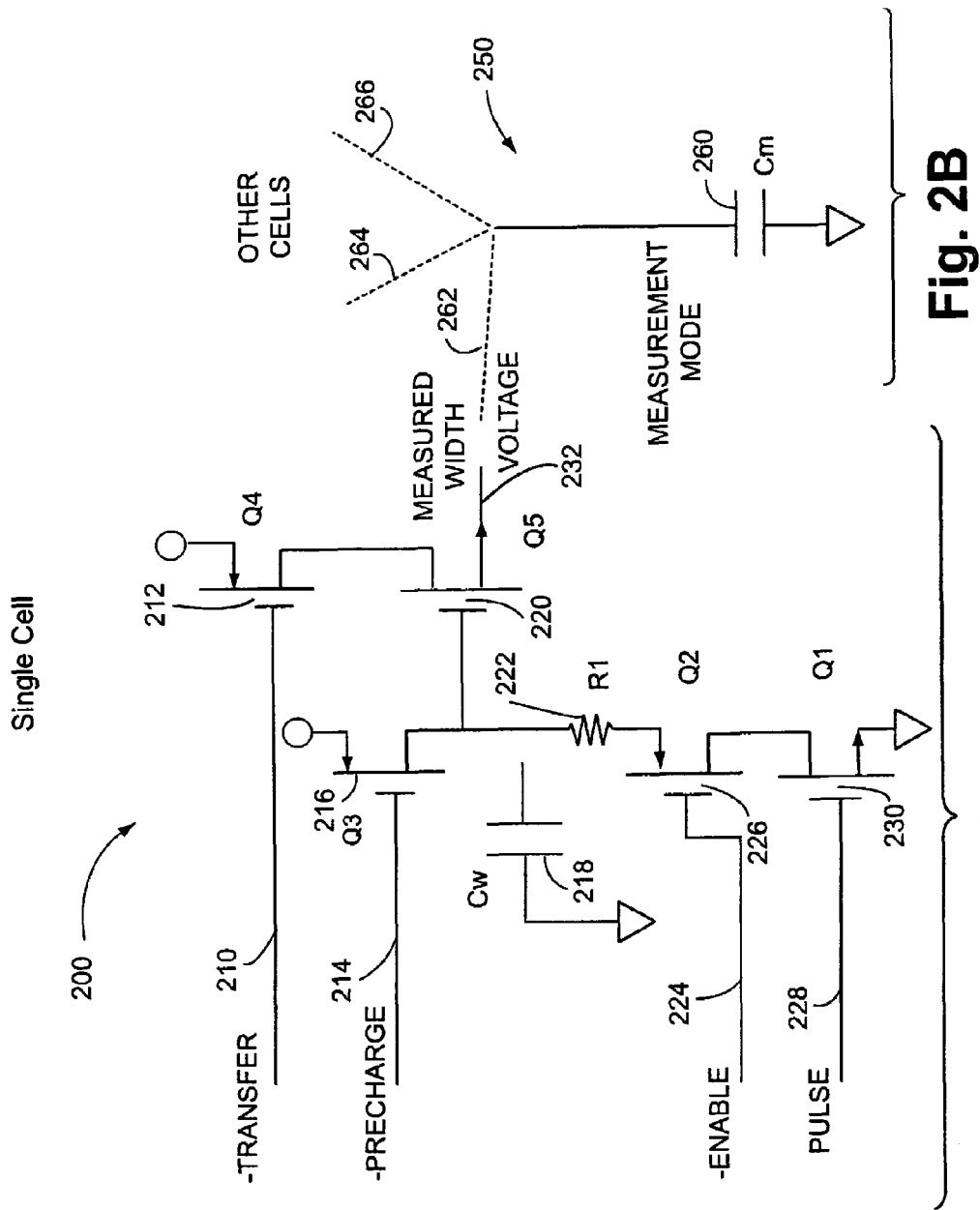

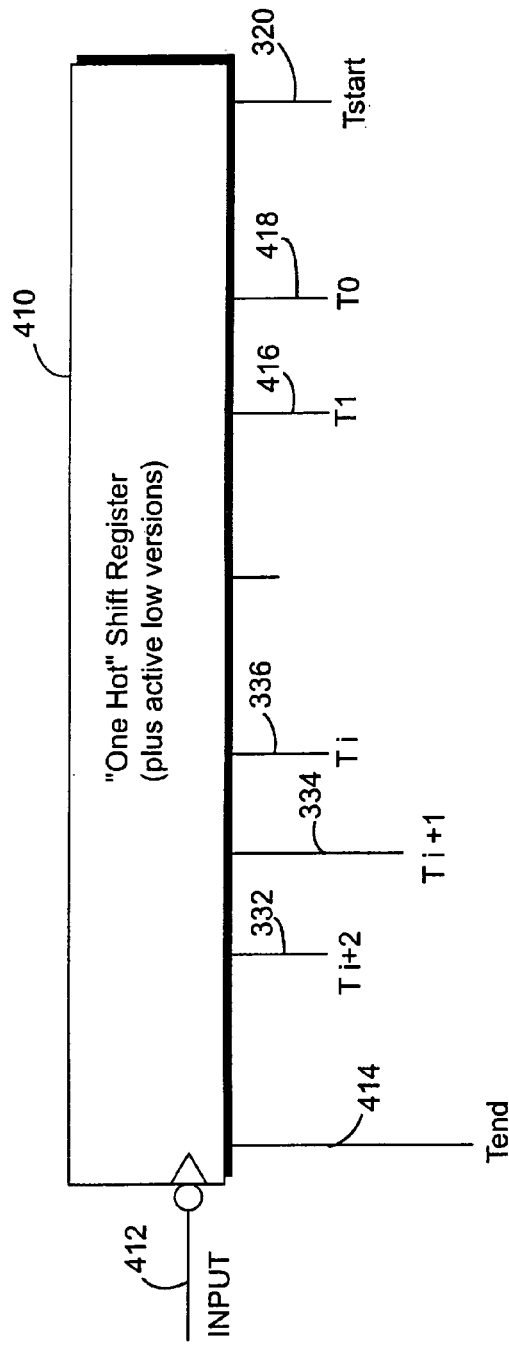
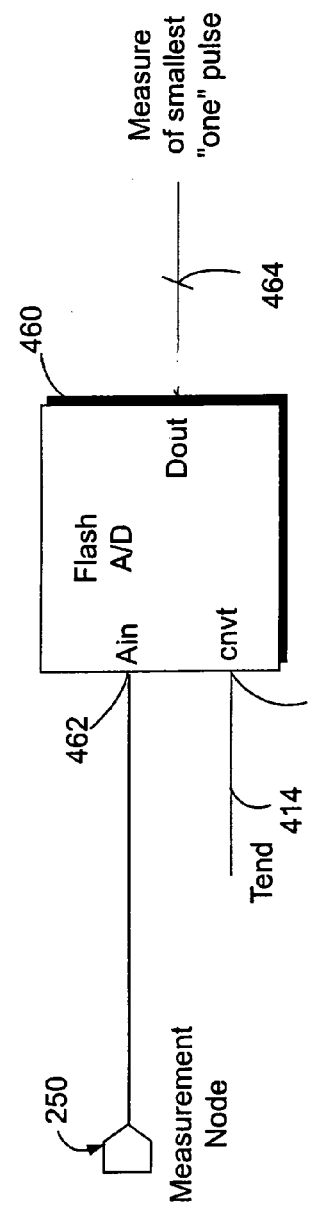
Fig. 4A
Timer Control
Fig. 4B

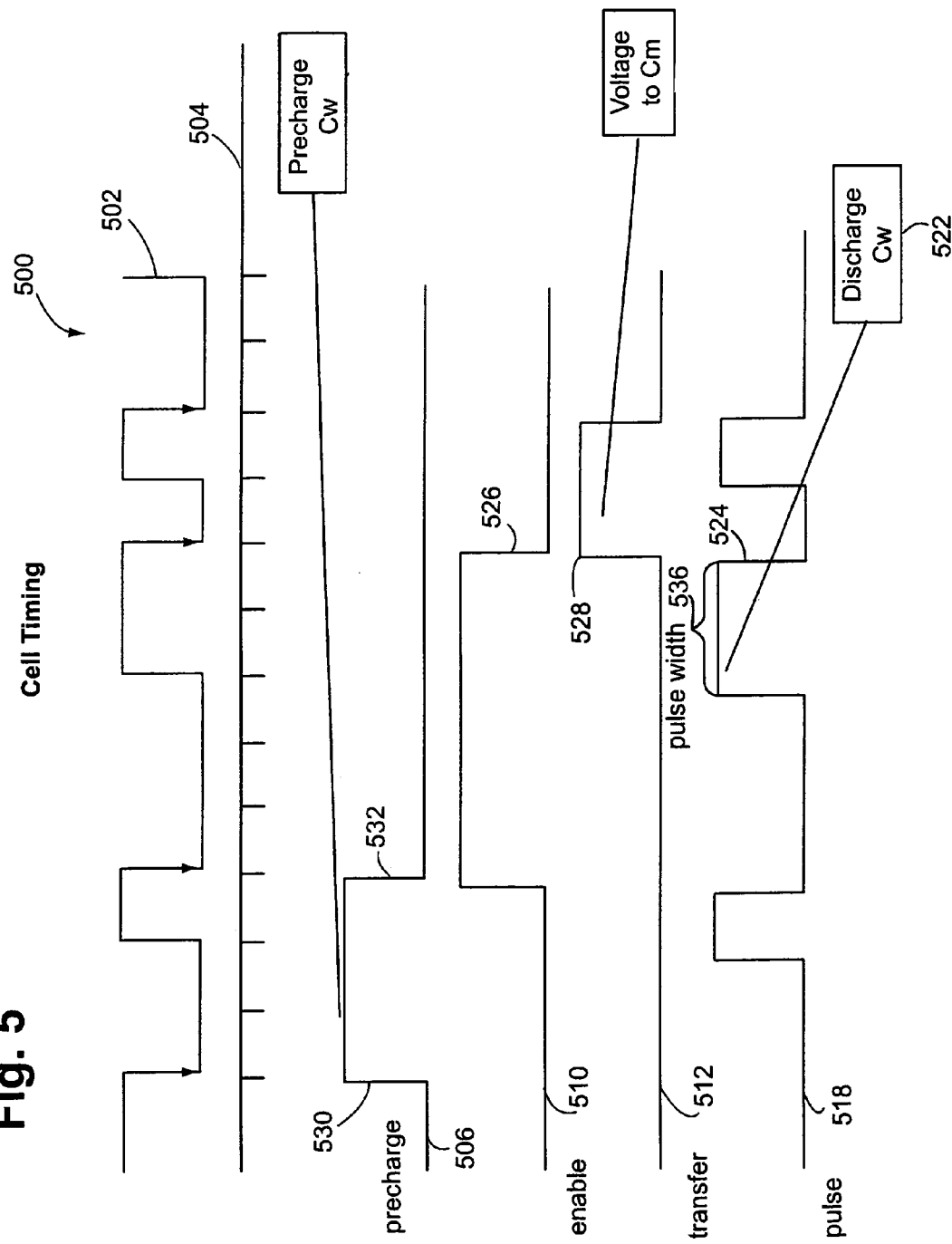

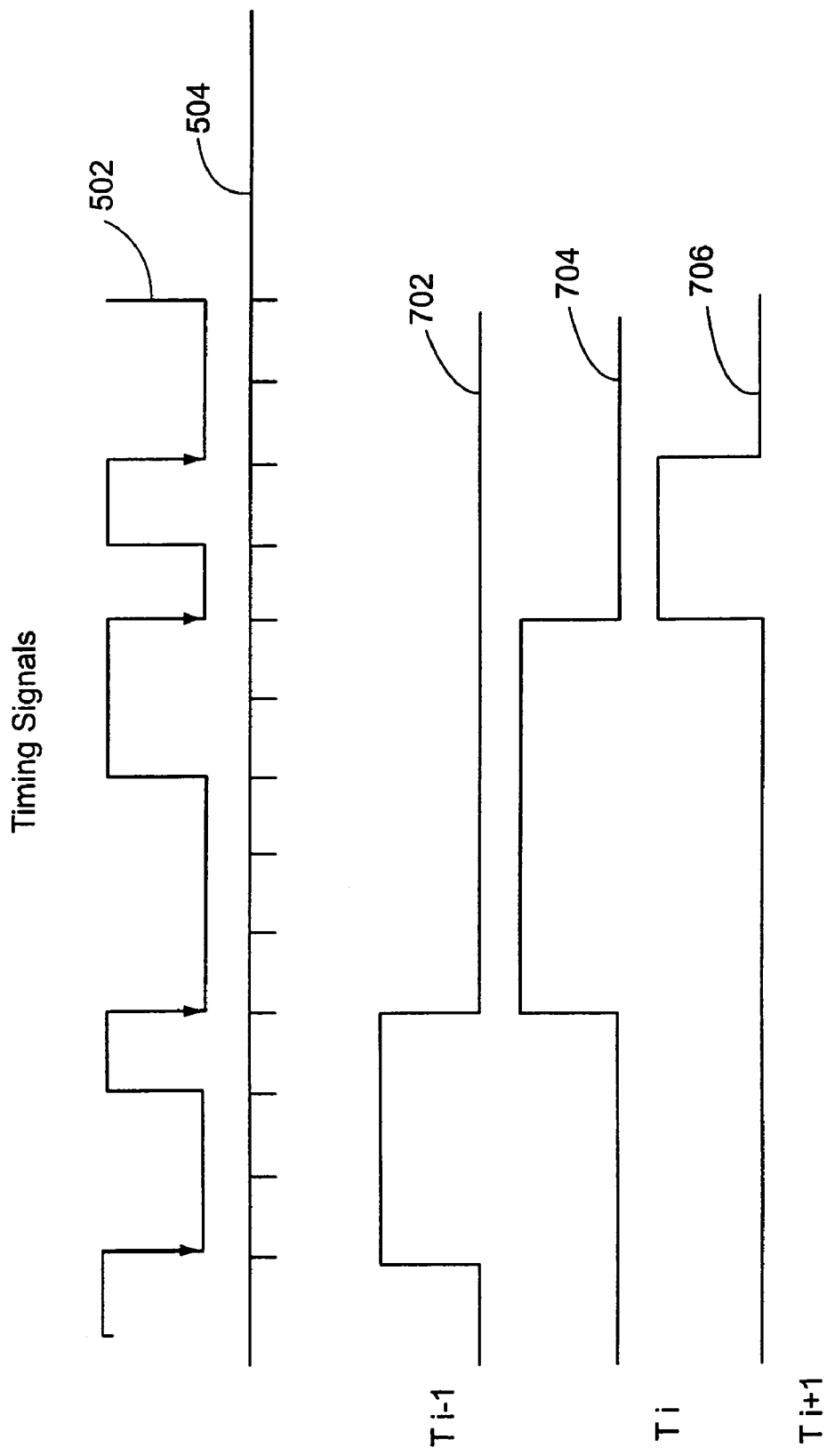

SYSTEM AND METHOD FOR DETERMINING THE DATA RATE OF A DIGITAL DATA STREAM

This application claims priority under 35 U.S.C. 119(e) from U.S. provisional patent application 60/208,005 having a filing date of May 26, 2000 which is entitled "System and Method for Determining the Bit Rate of a Digital Data Stream," inventor Hon Wah Chin, and which is hereby incorporated by reference.

FIELD OF INVENTION

The present invention relates generally to communication systems and more particularly, to a method and system for determining the bit rate of a digital data stream transmitted over high speed digital communication systems including, but not limited to, a fiber optic digital communication system.

BACKGROUND

Successful digital communications often requires an accurate determination of the bit rate of a digital data stream. An accurate bit rate determination would be particularly useful in long haul digital communication systems that use the adaptive, flexible "3R" method of regenerating the amplitude of the digital data stream, reshaping the pulses to remove distortion, and retiming the edges of the pulses for sharper transitions.

In addition, an accurate determination of the bit rate would also be quite useful in a billing system wherein customers are charged for the speed of their digital communications.

To obtain the bit rate, one method is to measure the pulse widths directly. However, at high transmission speeds, such as those prevalent in optical communications, this direct measurement can be difficult to do using digital circuits. Typically, the measurement would be done with a timer that counts clock ticks during the pulse. Several pulse widths would be measured. Different samples would then be compared over time to get the minimum pulse width used by the signal. This comparison would typically be done under microprocessor or digital logic control. For high speed signals, such as optical signals, which are roughly at the limit of counter speeds, it is difficult to count clock ticks and then to compare the times before the next pulse width sample arrives. Therefore, as transmission speeds increase, obtaining an accurate direct measurement of the minimum pulse width is increasingly more difficult.

SUMMARY

The limitations in the prior art are overcome by a system and method for determining a minimum pulse width for a digital data stream comprising a plurality of pulses in order to infer the data rate for the digital data stream by providing a circuit that does both the measurement and comparison of the pulse widths measurements. In one embodiment of the invention, a measuring cell is used to measure the pulse width by relating a voltage to it. This voltage is then transferred by the measuring cell to a measurement node which determines the minimum pulse width by retaining the maximum or minimum voltage, depending on the embodiment, of all the transferred voltages for the plurality of pulses.

In one embodiment of the present invention, measurements of the pulse width are obtained by utilizing charge/discharge or RC time constants. The measuring cell comprises a capacitor, that from being charged or discharged, is caused to have a change of voltage across it for a duration of the pulse being measured resulting in a measured width voltage that is related to the pulse width. In one embodiment, a switch is turned on to allow a capacitor to precharge to a first voltage. A second switch is enabled to allow a capacitor to discharge to a second voltage for the period of a pulse width. The narrower the pulse width, or the shorter the period of the pulse width, the less time the capacitor will have to discharge from its precharged voltage. Therefore, the shortest pulse will result in a maximum second voltage. A third switch will allow the transfer of the second voltage to the measurement node. In one embodiment, the measurement node is a capacitor which retains the maximum second voltage from the measurements.

After a selected criterion such as a period of time, a number of pulses, or a number of pulse transitions, for which measured voltages have been transferred to the measurement node, the voltage representing the minimum pulse width can then be converted by an analog to a digital converter into a digital value used to infer the data rate of the stream.

BRIEF DESCRIPTION OF THE DRAWINGS

FIG. 2A shows one embodiment of a measuring cell for measuring the width of a pulse in accordance with the present invention.

FIG. 2B illustrates an embodiment of a measurement node for detecting a voltage level associated with a minimum pulse width in accordance with the present invention.

FIG. 4A shows one embodiment of a timing controller as a shift register for sequencing a series of measuring cells in accordance with the present invention.

FIG. 4B is a block diagram of an analog to digital converter for converting the voltage representing the minimum pulse width to a digital value in accordance with the present invention.

FIG. 5 is a timing diagram of one embodiment of a measuring cell in accordance with the present invention.

FIG. 7 is an example of a timing diagram of one embodiment of a shift register being used as a timing controller in accordance with the present invention.

DETAILED DESCRIPTION

Figure 1:
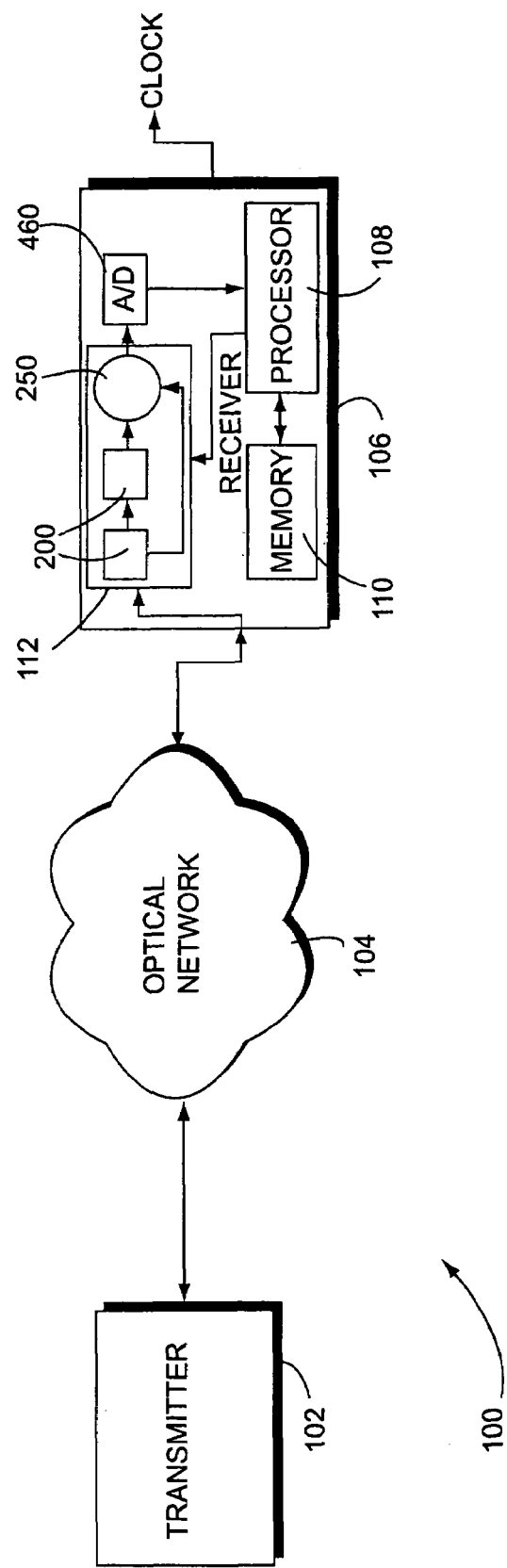
FIG. 1 shows an embodiment of a communication system in accordance with the present invention.

Referring to FIG. 1, there is shown a block diagram of a system 100 embodying the principles of the present invention. The system 100 comprises a transmitter 102 coupled to a receiver 106 via an optical network 104. The transmitter 102 generates an optical signal that replicates a digital data stream in which an input clock is embedded with the data. The optical signal is transmitted via the optical network 104 to the opto-electronic receiver 106. The receiver 106 detects the incoming optical signal and processes the received serial digital signal stream to recover the original data and the data rate of the digital data stream. In this embodiment, the receiver comprises a measurement unit 112 having one or more measuring cells 200 which are discussed in more detail with reference to FIG. 2A, and a measurement node 250, which is discussed in more detail with reference to FIG. 2B. In this example, the receiver also includes an analog to digital converter 460 which is discussed in more detail with reference to FIG. 4B, a processor 108 that is accessible to a memory 110 and the measurement unit 112. Once obtained, the data rate may then be used to determine the clock signal for the digital data stream. By measuring the width of a pulse from a digital data stream, the present invention advantageously allows determination of the data rate of the digital data stream.

FIG. 2A shows one embodiment of a measuring cell 200 for receiving the incoming optical signal and measuring the width of a pulse from a digital data stream. A measuring cell 200 comprises a capacitor 218, a resistor 222, a precharge switch 216 capable of being activated by a precharge input 214, an enable switch 226 capable of being activated by an enable input 224, a transfer switch 212 capable of being activated by a transfer input 210, a pulse switch 230 capable of being activated by a pulse input 228 and a measured width voltage switch 220 capable of transferring a measured voltage for each pulse to a measurement node 250 which is discussed in reference to FIG. 2B below.

Precharge input 214 activates or turns "on" precharge switch 216 to allow the capacitor 218 to charge to a precharge voltage. Once the capacitor 218 has stored the precharge voltage, precharge switch 216 is deactivated. The enable input 224 activates enable switch 226. Pulse input 228 activates pulse switch 230 upon the beginning of a pulse whose width will be measured. For the period of the pulse width, both the enable switch and the pulse switch are active thereby creating a path to ground so that capacitor 218 can discharge. At the end of the pulse width, the pulse switch 230 becomes inactive as does the enable switch 226. Transfer input 210 activates transfer switch 212 to allow measured width voltage switch 220 to transfer the capacitor's 218 voltage after discharge, the measured width voltage, to the measurement node 250.

In one embodiment, enable switch 226, precharge switch 216, and transfer switch 212 are on/off switches. In one embodiment, field effect transistors, in particular analog metal oxide semiconductor field effect transistors (MOSFET), are used as switches. Other switching technologies including, but not limited to, bipolar junction transistors, can also be used.

FIG. 2B illustrates an embodiment of a measurement node 250 comprising a measurement capacitor 260. As discussed with reference to FIG. 2A, after a pulse width has discharged capacitor 218 from its precharge voltage to a measured width voltage, transfer switch 212 activates measured width voltage switch 220 to transfer the voltage across measurement capacitor 260. Dashed lines 262, 264, and 266 indicate other measured width voltages received from other cells.

In one embodiment, the pulse switch 230 is an on/off switch, but in another embodiment, the pulse switch 230 can be tuned for the integrated circuit process by controlling the voltage of the pulse to be measured. Furthermore, the measured width voltage switch 220 can be embodied as a transistor 220 such as an analog MOSFET.

Figure 2C:
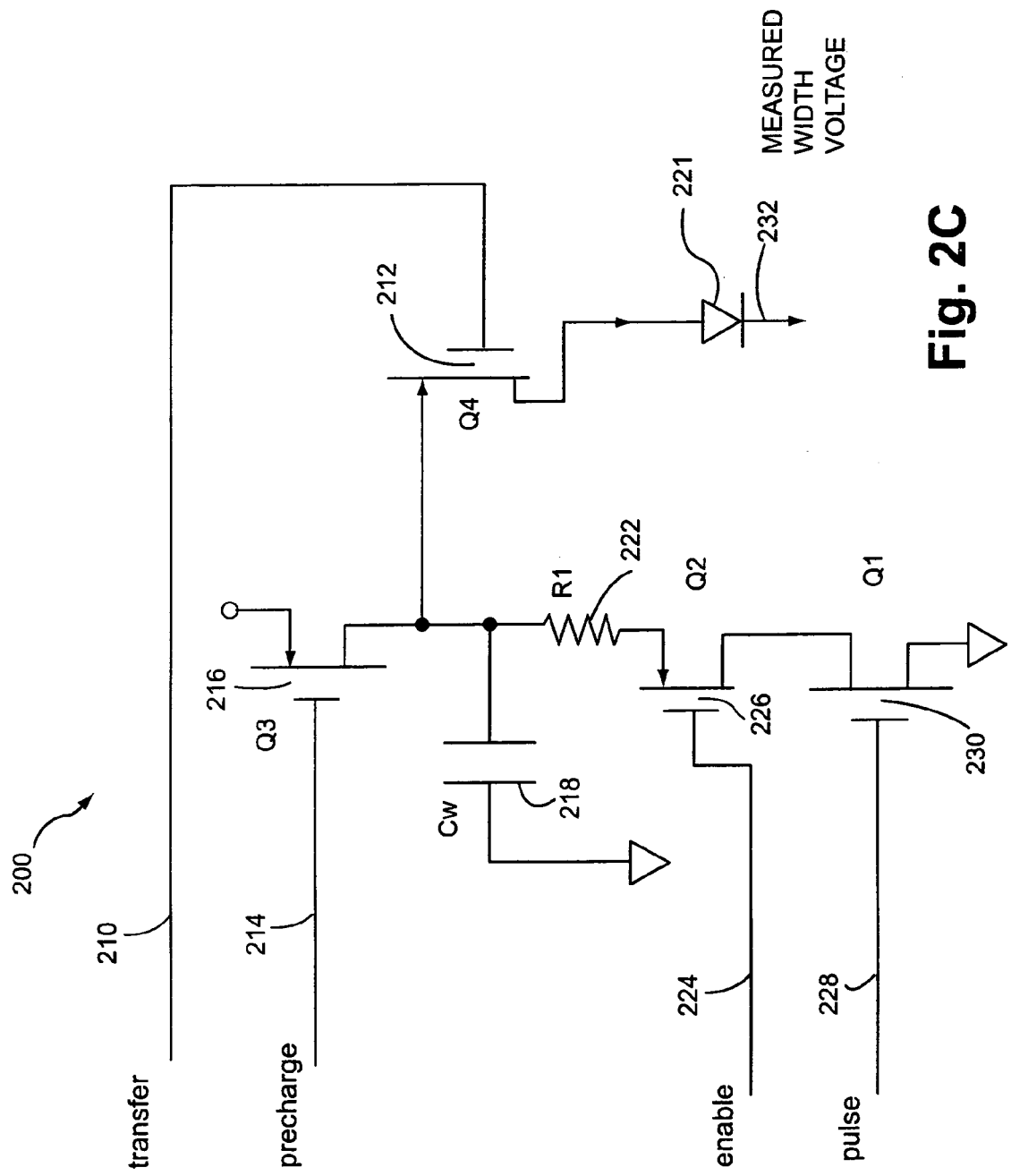
FIG. 2C shows an alternate embodiment of a measuring cell for measuring the width of a pulse in accordance with the present invention.

FIG. 2C shows an alternate embodiment of a measuring cell for measuring the width of a pulse in accordance with the present invention wherein the measured width voltage switch is embodied as a diode 221. The source of transfer switch 212 connects to the capacitor 218. Its drain would connect to the source of diode 221. When the gate of the transfer switch is activated or "turned on" by the transfer line, transfer switch 212 will allow the transfer of the measured width voltage 232 across the diode to measuring cell 250.

In another embodiment, the measuring cell can be configured so that capacitor 218 is charged during the period of the pulse so that a minimum measured pulse width indicates the minimum pulse width, and the measurement node capacitor can be configured to retain the minimum measured pulse width for the plurality of pulses.

In order to reset the measuring cell before the next pulse is processed, the time constant for precharging the capacitor, as determined by the properties of the capacitor 218 and the precharge switch 216, and the time constant for charging the measurement node's capacitor 260 to the measured width voltage, as determined by the measurement capacitor 260, the transfer switch 212 and the measured width voltage switch 220, both have to be much faster than the discharge constant for discharging the measuring cell's capacitor 218, as determined by capacitor 218, resistor 222, the pulse switch 230 and the enable switch 226. The discharge time constant, or in an alternate embodiment, the charge time constant, must be greater than the period of the pulse width. For example, in one embodiment, the discharge/charge time constant is set at ten times (10×) the minimum pulse width for the highest speed to be measured.

Figure 3:
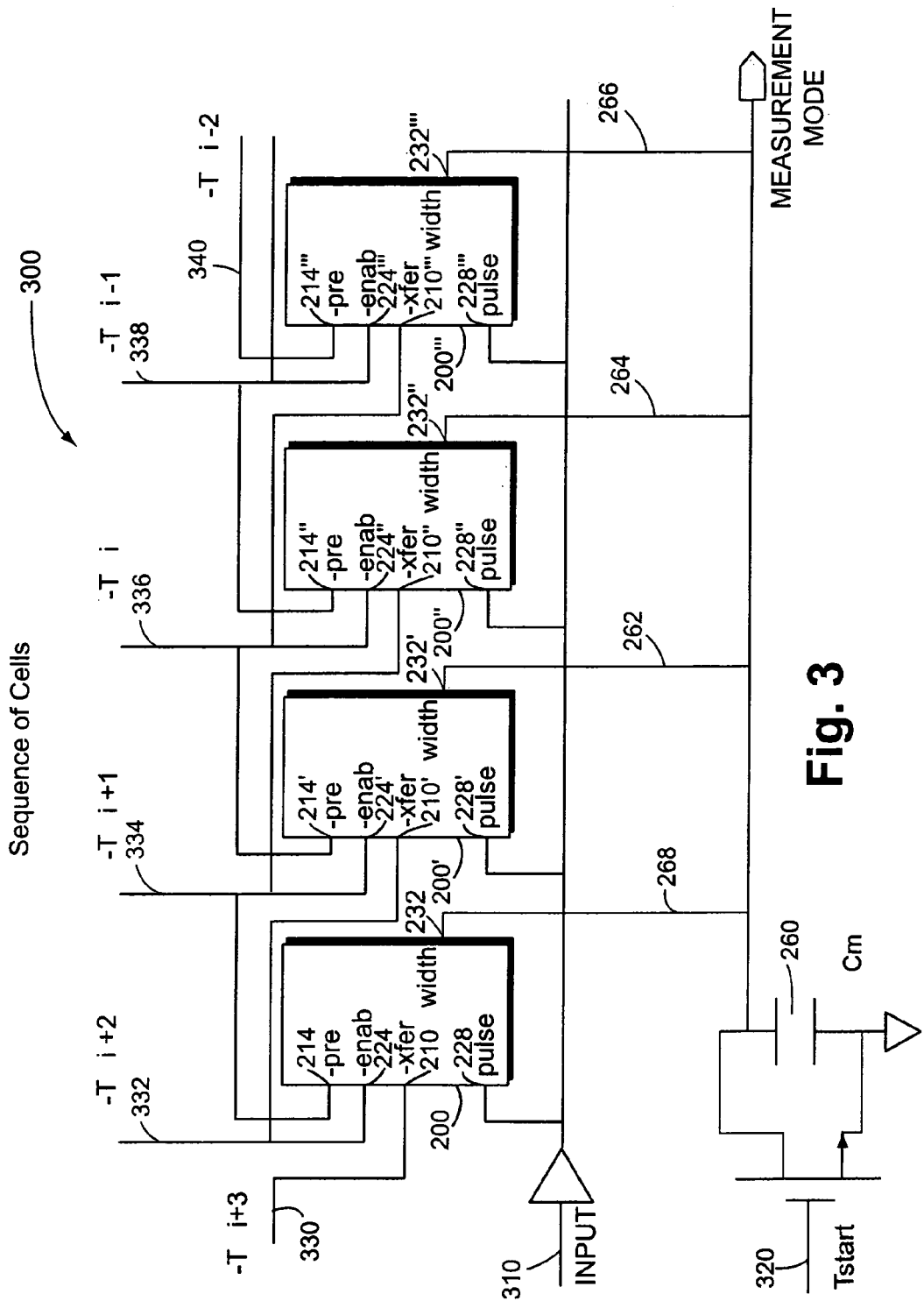
FIG. 3 shows one embodiment of a series of measuring cells for determining the minimum pulse width of pulses from a digital data stream in accordance with the present invention.

FIG. 3 shows one embodiment of a sequence of cells 300 for measuring the pulse widths of a plurality of pulses in a digital data stream in order to determine the bit rate. Each cell in the sequence comprises four signal inputs: a precharge input 214, an enable input 224, a transfer input 210 and a pulse input 228. Each cell further comprises a measured width voltage output line 268. The enable inputs 224, 224', 224" and 224'" are all tied to timing controller signal lines 340, 338, 336, 334, 332 and 330. Input signal line 310 receives the digital data stream of pulses. Timing Start Signal (Tstart) 320 in FIG. 3 is a timing signal that indicates the beginning of a measurement period determined by a selected number of time units, pulses, pulse transitions or other criteria, during which measured width voltages will be transferred to the measurement node in order to determine a minimum pulse width. Timing End Signal (Tend) 414, as discussed in FIG. 4A, is a signal indicating the end of the measurement period.

At the start of each measurement period, Tstart 320 clears the measurement node's capacitor 260. As shown in FIG. 3, each measuring cell's enable input 224,224',224", and 224'", is tied to one of the timing signal lines 332, 334, 336 and 338. As can be seen in FIG. 3, for cell 200", its enable input 224" is activated when a Current Enable Timing Signal (Ti) 336 becomes active. While enable input 224" is active, and the pulse width is being measured, the transfer input 210'" of cell 200'", is also active by virtue of being tied to timing signal Ti 336 so that this cell is transferring via its width output 232'" and output line 266, its measured width voltage to the measurement node. At the same time, the precharge input 214' of measuring cell 200' is precharging its capacitor 218 (See FIG. 2A), because this precharge input is tied to active timing signal Ti 336. Multiple sampling sequences can be used for obtaining the minimum pulse width.

The series of measuring cells as shown in FIG. 3 may be embodied in an integrated circuit chip (IC). In one embodiment, thirty (30) cells may be integrated on one chip resulting in a high probability of getting one minimum pulse in 60 transitions. The number of cells on a chip is determined by a number of factors including the tradeoffs between chip size, analog leakage of using many cells, speed of analog to digital conversion, and digital compare time of fewer cells in a chain.

If the values for capacitor 218, resistor 222, pulse switch 230 and enable switch 226 are matched across the measuring cells, the level for "pulse" can be used to trim the discharge time constant. A test section can be created on the chip with these components to be used for calibration. This timing chain can be used in a multivibrator circuit whose frequency would reflect the RC time constant. Adjusting the multivibrator to a predetermined frequency with the same voltage control for "pulse" in the measuring cells would control the time constant of the measuring cells so that the time constant is checked by watching the frequency.

The operation of the sequence of cells is controlled by a timing controller. In one embodiment, the timing controller may be embodied as computer instructions executed by a processor 108. FIG. 4A shows one embodiment of a timing controller, a shift register 410. Shift register 410 comprises a measurement period start timing signal line Tstart 320 and a measurement period end timing signal line Tend 414. Such a measurement period may be selected to be a certain number of pulse transitions, for example, sixty (60) transitions. Shift register 410 further comprises a plurality of timing signal lines 332, 334, 336, 416, 418. The measurement period may be explicitly started by an external signal applied to the measurement period start signal line Tstart 320 or the period may be started on latch of the pulse stream to signal line Tstart 320.

The register can control the timing of the sequence of cells in FIG. 3 by shifting only one active bit at a time so as to activate only one timing signal line at a time as illustrated in FIG. 7 discussed below. For the embodiment of FIG. 3, only the enable input tied to the timing signal of the active bit is active. Different logic can be employed to control the timing sequence. The timing controller can be implemented by any timing controller techniques, including, but not limited to, those implemented in hardware, software or optically.

FIG. 4B shows one embodiment of an analog to digital converter 460 shown as a flash A/D converter, comprising an analog input 462 for receiving an analog measurement from measurement node 250, a conversion signal input 466 shown connected to the measurement period end signal line Tend 414, and a digital value output 464 representing the measured width voltage of the shortest pulse width. This digital value is then used to determine the bit rate. For example, the value may be compared against a range of voltage values indicating cutoffs for different clock rates.

FIG. 5 shows an example of a measurement cell timing diagram 500 for the operation of the embodiment of the invention illustrated in FIG. 2A. The diagram comprises a precharge line 506, an enable line 510, a transfer line 512 and a pulse line 518 for a sequence of pulses to be measured, the digital data stream 502 and a reference line 504 divided into equal periods.

If the digital data stream is being transmitted in typical Manchester, NRZ (non return to zero) or NRZI (non return to zero inverted) transmissions, the "1" pulses and the "0" pulses have statistics reflecting an approximately fifty percent (50%) balance between the "1" pulses and the "0" pulses so that measurement of either type of pulse should give the same result. However, measuring both can compensate for signal distortion where the 1->0 transition time is different from the 0->1 time. In one embodiment of the invention, for a series of pulses, the "1" pulses may be measured, and then the "0" pulses measured for a subsequent series of pulses. The timing controller can be configured to cause measurements to be made on the different transitions between "1" and "0". Differences in the values of the maximum voltages for each series for the embodiment of FIG. 3 can be used to determine and compensate signal distortion.

There is also RZ (return to zero) transmission where a "1" is indicated by a pulse, returning to zero before the next data bit, and a "0" is indicated by the absence of a pulse (rising edge) at the time where the next data bit should be. In this case, the measurement of the "1" pulse width would be different from the "0" pulse width and both would be useful. For most actual RZ situations once it is known to be RZ, measuring the "0" time would be the easiest way to determine the data rate.

FIG. 5 is discussed in reference to the embodiment of a measuring cell as illustrated in FIG. 2A. Transition 530 indicates that precharge switch 216 has become active to allow the measuring cell capacitor 218 to charge to a precharge voltage. Transition 532 indicates that precharge switch 216 has become deactivated. At approximately the same time as transition 532, transition 534 indicates that enable switch 226 is becoming active so that now a pulse width may be measured. Because the enable switch 226 is active, pulse 536 that activates pulse switch 230 can allow capacitor 218 to discharge for its measured width voltage as indicated by box 522 for the period of the pulse width. Transition 524 indicates the end of the pulse width, and therefore the end of the discharge of capacitor 218. The enable switch becomes deactivated at the same time as shown by transition 526. Transition 528 shows transfer switch 212 being activated to allow the transfer of the measured width voltage to the measurement node 250.

Figure 6:
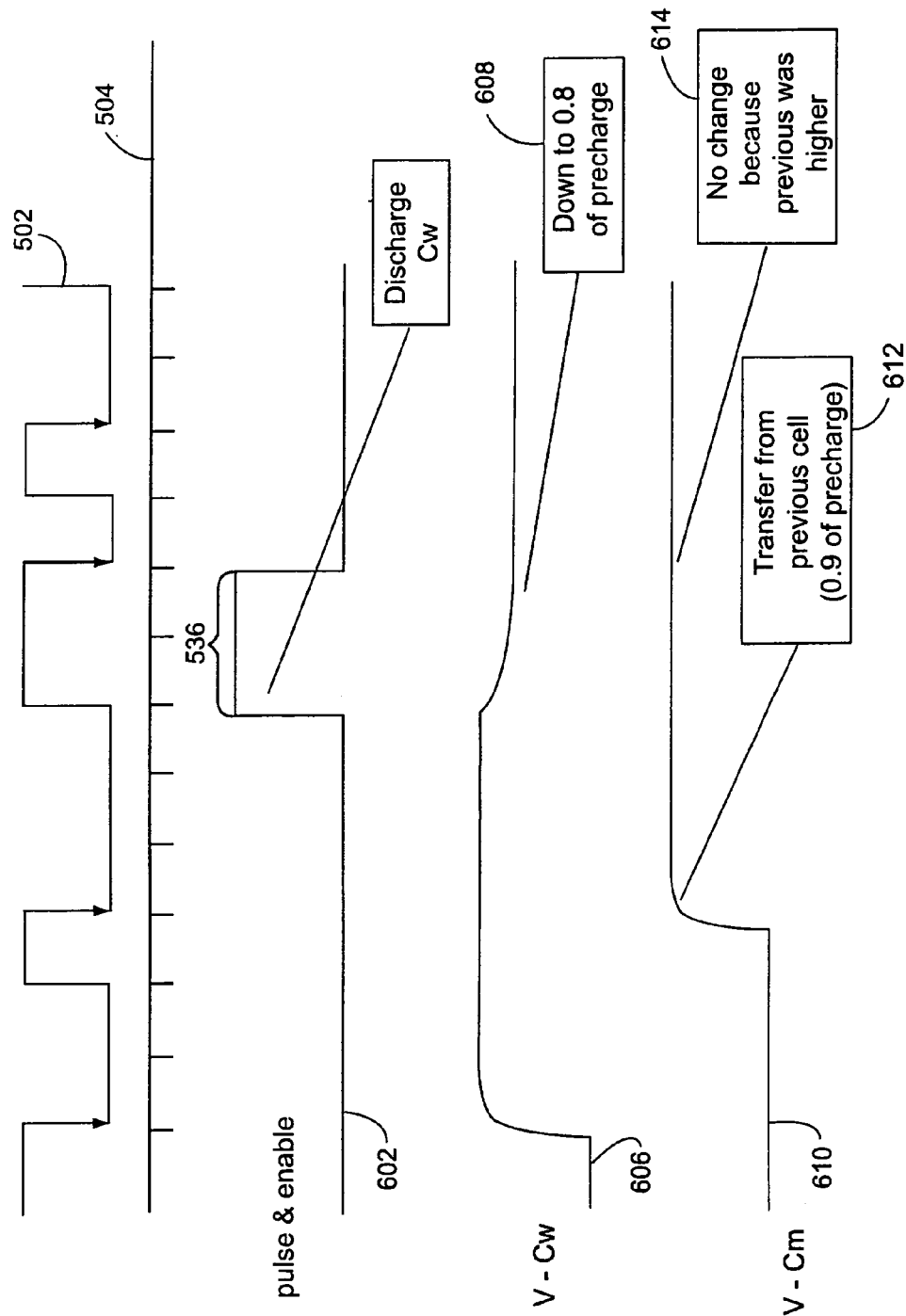
FIG. 6 is a timing diagram of one embodiment of a measurement node in accordance with the present invention.

FIG. 6 illustrates a timing diagram for the embodiment of the measurement node 250 shown in FIG. 2B. The diagram comprises the digital data stream 502, a reference line 504 divided into equal periods, a combined pulse and enable timing line 602 indicating measured pulse 536, a measuring cell capacitor voltage line 606, and a measurement node capacitor voltage line 610.

Measuring cell capacitor voltage line 606 indicates that the measuring cell capacitor 218 is discharged to 80 percent of the precharge voltage level during pulse 536, as denoted in box 608. The measurement node capacitor voltage line 610 indicates that before capacitor 218 discharged for the measurement of pulse 536, a previous measured width voltage of 90 percent of the precharge voltage level was transferred from the previous measuring cell 612. As line 610 indicates, there is no change in the voltage level of the measurement node because the previous measured width voltage had a higher value 614.

In this example, the lower voltage will not change the higher voltage already stored by the capacitor. In an alternate embodiment wherein, the capacitor is charged as opposed to discharged, during the pulse width, the measurement node would be embodied to retain the minimum voltage of measured width voltages representing a plurality of pulse widths.

FIG. 7 is a timing diagram for the shift register of FIG. 4A. The diagram comprises the digital data stream 502, a reference line 504 divided into equal periods, a timing line 702 for timing signal line 338, a timing line 704 for timing signal line 336 and a timing line 706 for timing signal line 334. As indicated in FIG. 7, for this embodiment, only one timing signal line is active at a time so that only one cell's enable input is active at a time.

The following example is provided to illustrate how an embodiment of the present invention may be used to determine a bit rate. In a fiber optic network, the network may operate at the optical carrier rates of OC-48 (2.488 Gbps), Gigabit Ethernet (1 Gbps), OC-12 (622.08 Mbps) or OC-3 (155.52 Mbps). The discharge constant for the embodiment of the measuring cell shown in FIG. 2A is calibrated to be ten times (10×) the minimum pulse width for the highest speed to be measured which is OC-48. The time constant is therefore, 10×804 ps=804 ps. Exponential decay would indicate that if the discharge voltage is 90 percent of the precharge voltage, than the rate being used is OC-48. Gigabit Ethernet would be identified by a discharge voltage of 82 percent of the precharge voltage. For OC-12, 67 percent of the precharge voltage may be used to distinguish this rate. Twenty (20) percent of the precharge voltage may be used to indicate that OC-3 is being used. With a 2.5V precharge voltage, the voltage levels of 2.15V, 1.85 V, and 1.08V may be used as upper and lower limits for ranges of values corresponding to these four bit rates. For example, a converted digital value from the measurement node of 2.0V would indicate that GigE is being used but not OC-48, so a customer in a billing system would be charged at the lower bandwidth rate.

In order to relax the required precision of various components, information about the expected bit rates may be used. As described above, a measurement within a range can be used by the overall system to distinguish between a set of more precise bit rates, such as Gigabit Ethernet (100 ppm) or OC-12 (20 ppm). For example, in the embodiment of FIG. 1, a lookup table of the range values may be stored on the memory 110. The processor 108 can be programmed to read ranges of values from the lookup table to determine whether the digital value from the A/D converter 460 falls within a range associated with a particular bit rate.

From the above description, it will be apparent that the invention disclosed herein provides a novel and advantageous system and method for determining a minimum pulse width for a digital data stream comprising a plurality of pulses. The foregoing discussion discloses and describes merely exemplary methods and embodiments of the present invention. As will be understood by those familiar with the art, the invention may be embodied in other specific forms, such as having a capacitor charge rather than discharge during the pulse width measurement, without departing from the spirit or essential characteristics thereof. Accordingly, the disclosure of the present invention is intended to be illustrative, but not limiting, of the scope of the invention, which is set forth in the following claims.

What is claimed is:

1. A method for determining a data rate for a digital data stream comprising a plurality of pulses, each pulse having a width, the method comprising:
   directly measuring the width of each pulse from the plurality of pulses by a measuring cell utilizing RC time constants wherein each pulse width is represented by a measured width voltage;
   transferring said measured width voltage to a measurement node wherein said measurement node determines the measured width voltage of a minimum pulse width;
   converting the measured width voltage of the minimum pulse width from an analog value to a digital value; and
   determining a range within which the digital value falls, each range being associated with a different data rate.

2. A method for determining a data rate for a digital data stream, the digital data stream comprising a plurality of pulses, each pulse having a width, the method comprising:
   measuring the width of each pulse from the plurality of pulses;
   determining a minimum pulse width by using the measured width of each pulse from the plurality of pulses; and
using the minimum pulse width to infer the data rate,
wherein the step of measuring the width of each pulse from the plurality of pulses comprises the substeps of:
   causing a change of voltage across a capacitor for a duration of the pulse resulting in a voltage level of the capacitor for the pulse; and
   measuring the voltage level of the capacitor.

3. The method of claim 2 wherein the step of determining the minimum pulse width by using the measured width of each pulse from the plurality of pulses comprises the substep of:
   determining a maximum voltage level for the plurality of pulses.

4. A method for determining a data rate for a digital data stream, the digital data stream comprising a plurality of pulses, each pulse having a width, the method comprising:
   measuring the width of each pulse from the plurality of pulses;
   determining a minimum pulse width using the measured width of each pulse from the plurality of pulses; and
using the minimum pulse width to infer the data rate,
wherein the step of using the minimum pulse width to infer the data rate comprises the substep of:
   converting the minimum pulse width to a digital value.

5. The method of claim 4 wherein the step of using the minimum pulse width to infer the data rate further comprises the substep of:
   determining a range of values within which the digital value falls, each range indicating a different data rate.

6. A system for determining a data rate for a digital data stream, the digital data
   stream comprising a plurality of pulses, each pulse having a width, the system comprising:
   a plurality of measuring cells for measuring the width of a pulse from the plurality of pulses; and
a measurement node for determining a minimum pulse width for the plurality of pulses,
wherein each measuring cell of the plurality of measuring cells comprises:
   an RC circuit for producing a measured width voltage having a value related to the duration of the pulse, said RC circuit including a capacitor.

7. The system of claim 6 wherein each measuring cell of the plurality of measuring cells further comprises:
   a pulse switch activated by a pulse of the digital data stream, the switch being connected to the RC circuit for causing a change of voltage to occur across the capacitor for the pulse of the digital data stream, resulting in a measured width voltage for that pulse of the digital data stream.

8. The system of claim 7 further comprising:
   an analog to digital converter for converting the measured width voltage associated with the minimum pulse width to a digital value.

9. The system of claim 7 wherein each measuring cell of the plurality of measuring cells further comprises a transfer switch connected to the RC circuit for transferring upon activation the measured width voltage to the measurement node.

10. The system of claim 9 wherein each measuring cell of the plurality of measuring cells further comprises a pre-charge switch connected to the RC circuit for setting the voltage across the capacitor in the RC circuit to a predetermined level when a pulse duration is not being measured.

11. The system of claim 10 wherein one or more of the switches are embodied as analog metal oxide semiconductor field effect transistors (MOSFETs).

12. A system for determining a data rate for a digital data stream, the digital data stream comprising a plurality of pulses, each pulse having a width, the system comprising:
a plurality of measuring cells for measuring the width of a pulse from the plurality of pulses; and
a measurement node for determining a minimum pulse width for the plurality of pulses,
wherein the measurement node determines a maximum voltage level for the plurality of pulses.

13. The system of claim 12 further comprising a timing controller for sequencing the plurality of measuring cells for measuring the widths of the plurality of pulses.

14. A system for determining a data rate for a digital data stream, the digital data stream comprising a plurality of pulses, each pulse having a width, the system comprising:
a plurality of measuring cells for measuring the width of a pulse from the plurality of pulses;
a measurement node for determining a minimum pulse width for the plurality of pulses;
an RC circuit for producing a measured width voltage having a value related to the width of the pulse;
a timing controller for sequencing the plurality of measuring cells for measuring the widths of the plurality of pulses;
an analog to digital converter for converting the measured width voltage associated with the minimum pulse width to a digital value; and
a processor having access to the digital value and to a memory comprising a lookup table having ranges of values, each range being associated with a different data rate, wherein said processor determines the data rate by reading ranges from the lookup table to determine the range which contains the digital value.

* * * * *